United States Patent [19]

Zielinski

[11] Patent Number: 5,786,547

[45] Date of Patent: Jul. 28, 1998

[54] DOOR ASSEMBLY FOR SHIELDED ROOM

[75] Inventor: Stanley J. Zielinski, Glendale Heights, Ill.

[73] Assignee: The Curran Company, Glendale Heights, Ill.

[21] Appl. No.: 651,605

[22] Filed: May 22, 1996

Related U.S. Application Data

[63] Continuation-in-part of Ser. No. 346,082, Nov. 29, 1994, Pat. No. 5,569,878.

[51] Int. Cl.$^6$ ................................................ H05K 9/00
[52] U.S. Cl. ................................. 174/35 MS; 49/303
[58] Field of Search ........................ 174/35 R, 35 MS; 361/816, 818; 277/34; 49/303, 306, 307, 308

[56] References Cited

U.S. PATENT DOCUMENTS 5,569,878  10/1996  Zielinski .................... 174/35 R Primary Examiner—Kristine L. Kincaid
Assistant Examiner—Hung V. Ngo
Attorney, Agent, or Firm—Cherskov & Flaynik

[57] ABSTRACT

A door assembly for an EMI shielded room includes a door structure defining an inner space parallel to the door faces. Plates are mounted in the space for movement toward and away from the door edges. Support and guide assemblies precisely regulate the plate movement. Either a pneumatic bladder, or a camming system, spaced inward from the door edges forces the plates to move outward from the door edges and parallel with the door plane. Return springs retract the plates when either the bladder is deflated, or the camming system is manipulated back to an at-rest position. The outer borders of the plates carry bumpers that force flexible contact members into engagement with the jamb and threshold of a doorway.

13 Claims, 5 Drawing Sheets

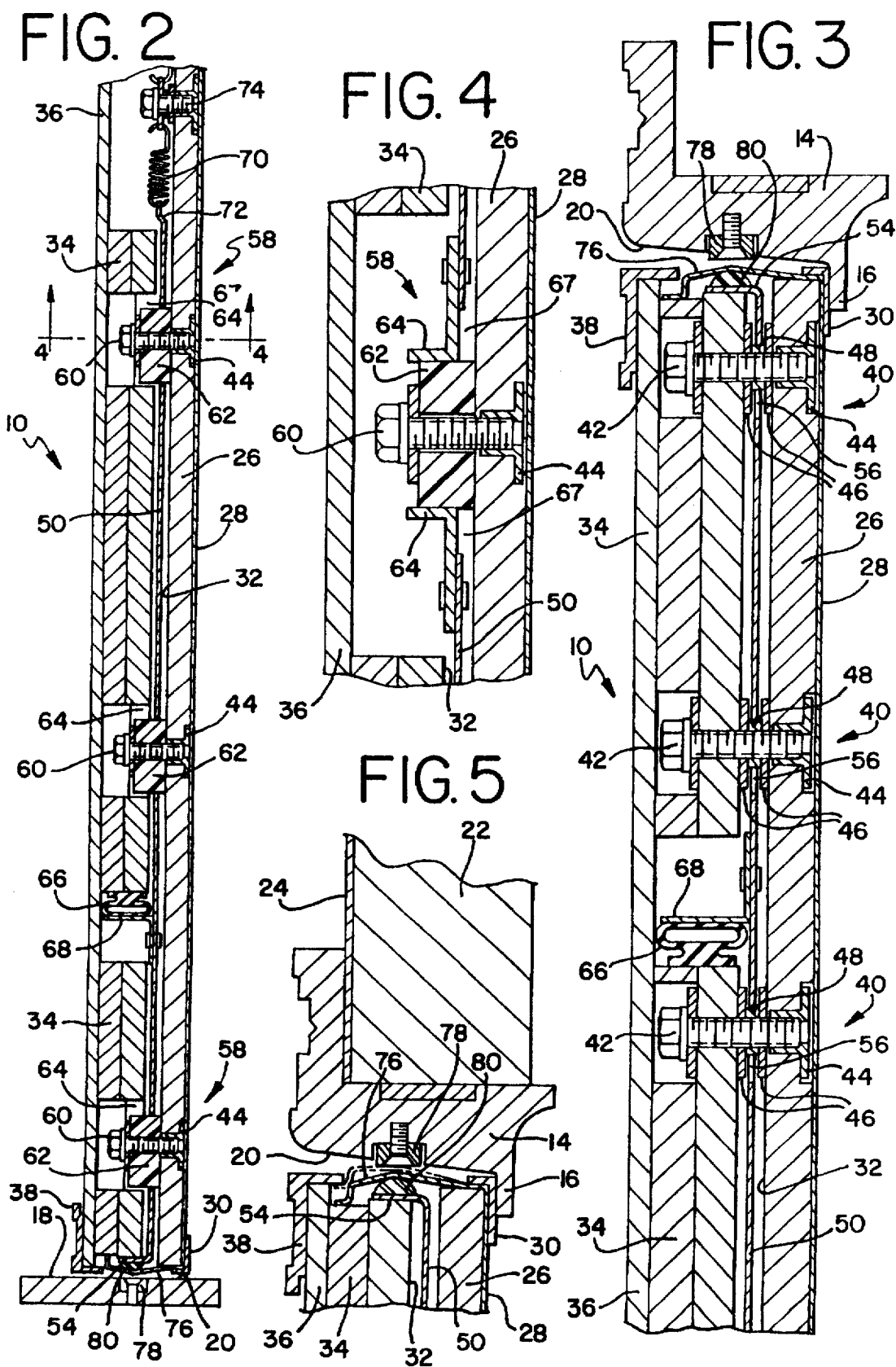

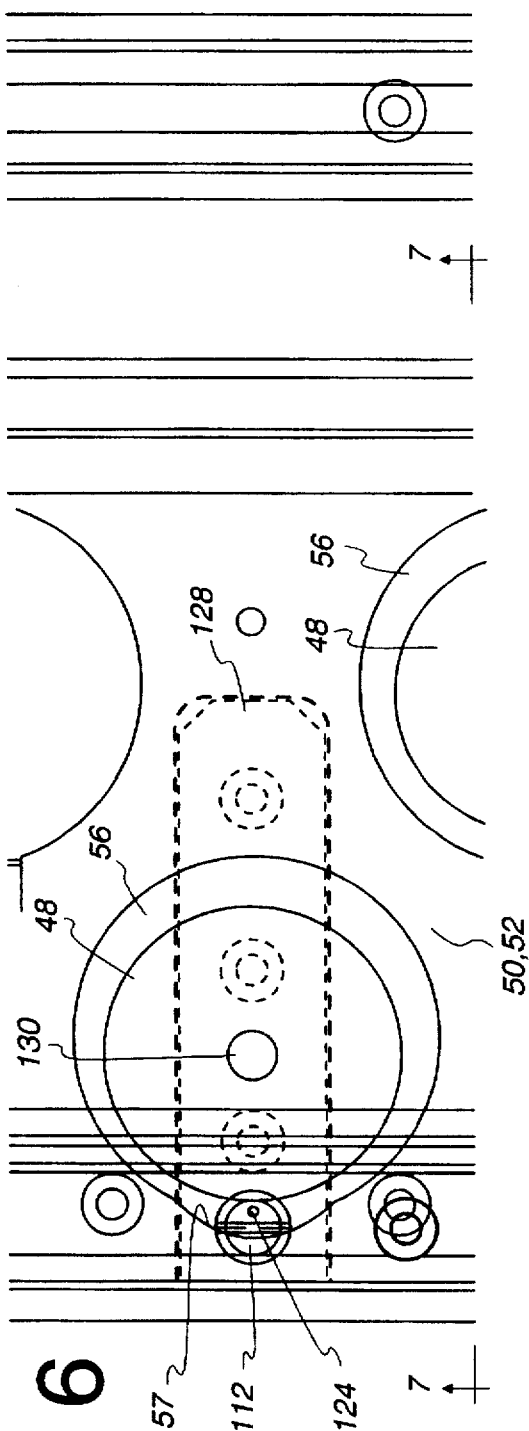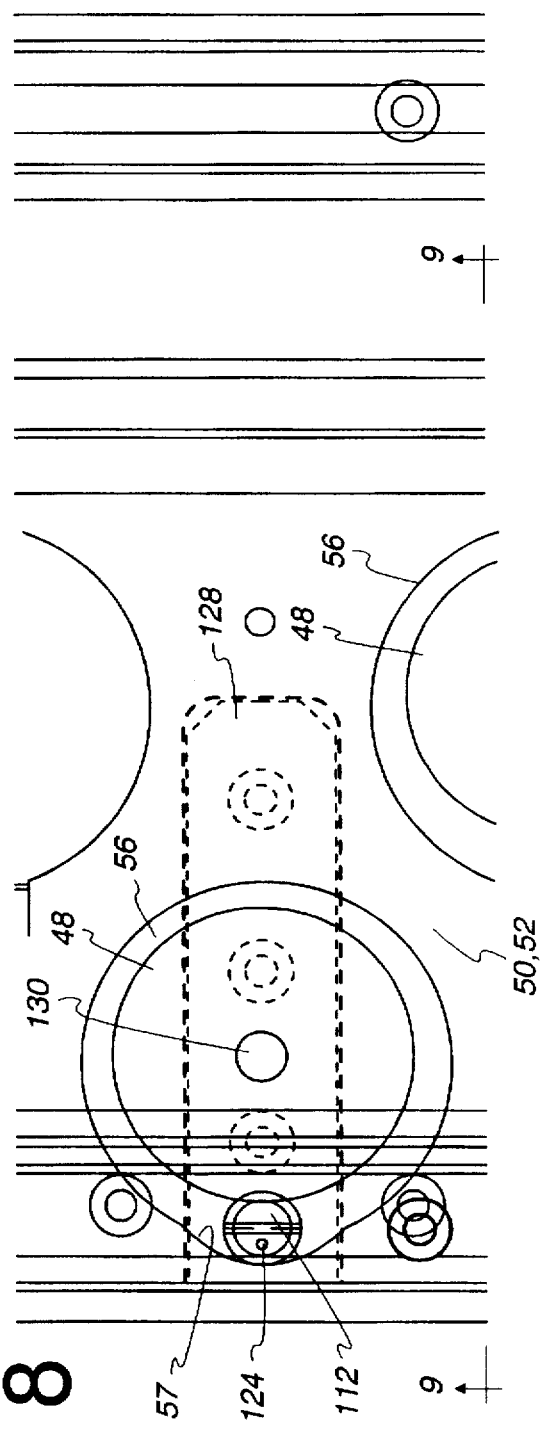

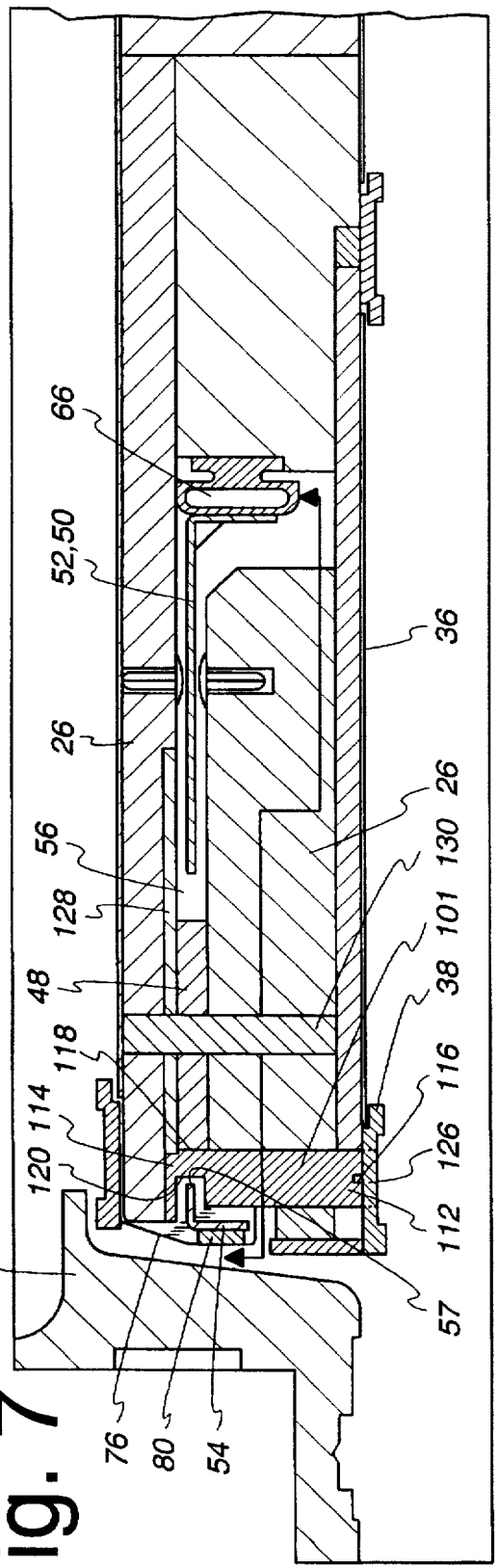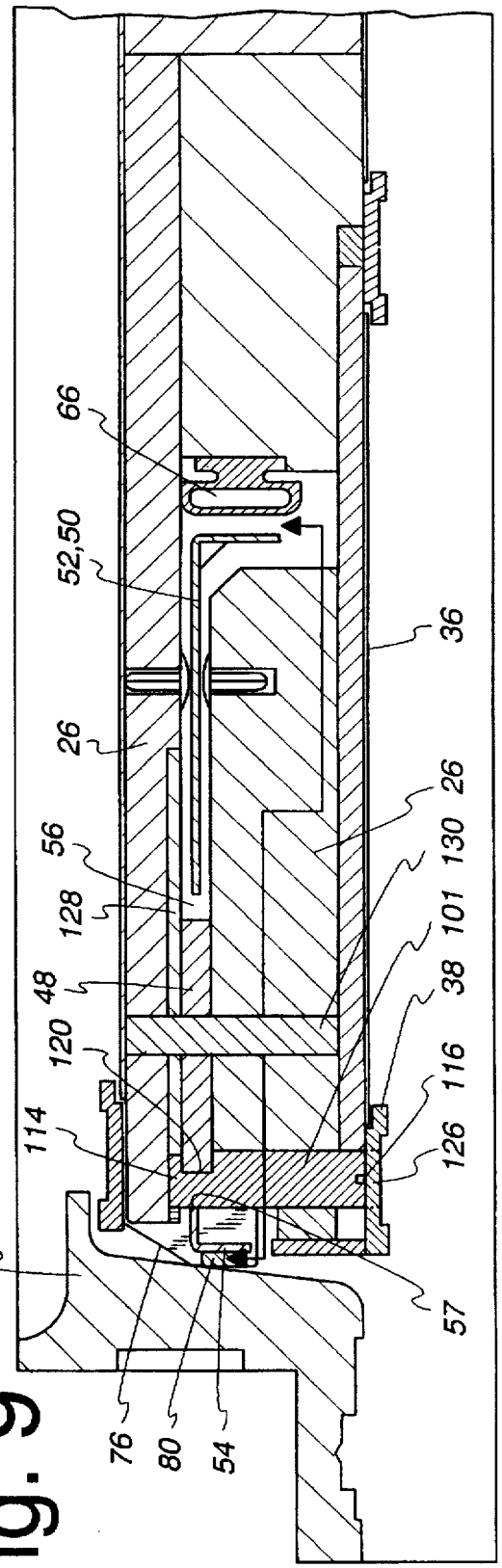

DOOR ASSEMBLY FOR SHIELDED ROOM

This application is a Continuation-in-Part of the patent application entitled DOOR ASSEMBLY FOR SHIELDED ROOM, (Ser. No. 08/346,082) filed on Nov. 29, 1994, and now U.S. Pat. No. 5,569,878.

BACKGROUND OF THE INVENTION

1. Field of the Invention

The present invention relates to electromagnetic interference (EMI) shielding and more particularly to a door assembly for a shielded room.

2. Background of the Invention

Shielded rooms are used to attenuate interference from electromagnetic radiation such as radio frequency (RF) radiation. The walls, floor and ceiling of a shielded room are typically provided with single or multiple shields of electrically conductive metal sheets, mesh or screen. Such rooms are used for many types of shielding applications where radiation must be contained within a room or prevented from entering a room. One example is a room containing magnetic resonance imaging (MRI) apparatus.

A door is typically provided so that personnel may enter and leave the room. In order to maintain the integrity of the shielding, the door itself includes a shield in the form of one or more layers of metal sheet, mesh or screen. When the door is in its closed position, the gap between the door and the jamb must be shielded and the shield of the door must be continuously and intimately connected to the shield of the room throughout the gap at the sides, top and bottom of the door. Although door assemblies for EMI shielded rooms have included various types of door gap shielding systems, each known type has disadvantages.

One door gap sealing system uses flexible contact fingers along the edges of the door wherein the fingers are connected to the door shield. When the door is closed, the fingers resiliently engage a contact area on the door jamb. U.S. Pat. No. 4,786,758 discloses a particularly effective example of this type of system. Although the shield disclosed in that patent has been successful, it is subject to the disadvantage that when the door is moved into or out of the closed position, force is necessary to overcome friction between the resilient fingers and the jamb. Systems using fingers are also subject to damage and need repair if the fingers are broken or deformed.

Another approach has been to use a pneumatic bladder running down the door edge to force a conductive braid out against the jamb with air pressure when the door is closed. With this system, the conductive braid does not engage the jamb until after the door has been closed. While this configuration minimizes the frictional force problems inherent with those designs mentioned supra, these pneumatic systems also have disadvantages. For one thing, systems of this type require doors and jambs with rounded rather than square corners because the bladder cannot operate around sharp corners. In addition, the braid can become rough or abrasive after a period of use. Another major disadvantage is that the braided or otherwise electrically conductive material covered bladder results in two seals rather than one. Each of these two seals represent a potential point of RF leakage. Also, because the braid or other electrically conductive material must be flexible, such seals are not capable of providing the same level of shielding effectiveness as solid metallic contact fingers. Further, such seals are not easy to clean.

When pneumatically actuated or electro-mechanically operated systems malfunction, continual use of the door is prevented, in as much as no backup system exists to actuate (even temporarily) the door-to-room seal. If such a malfunction occurs while the room is occupied (and the door-wall seal is intact), damage to the sealing system and adjacent structures is possible when repeatedly forcing the door open and closed. If a malfunction occurs when the door is open, then the room cannot be used at all until repairs to the door system are made. As such, door-sealing malfunctions cause expensive down-times and potentially high repair costs for MRI shielded room operators.

A need exists in the art for a door assembly to provide an effective door-to-room shield for EMI enclosures. The assembly should provide a back-up mechanism whereby if the main embodiment for providing an effective door-to-room seal malfunctions, the door is still operable and the EMI enclosure still can be used with no degradation in door-to-room shielding effectiveness.

SUMMARY OF THE INVENTION

A principle object of the present invention is to provide an improved door assembly for shielded rooms having a door gap shielding system that avoid frictional forces when the door is moved to or from the closed position yet permits square corners and presents a rugged, smooth and long lasting door edge. Another object is to provide a door assembly that overcomes the disadvantages of shielded room door assemblies used in the past.

Yet another object of the present invention is to provide a door assembly that can effect an EMI seal with a door jamb of an EMI enclosure either manually or electro-mechanically. A feature of the invention is the availability of a manually-actuated pusher assembly to alternately apply and deapply an EMI seal between the door and the door jamb. An advantage of the invention is conferring continued operability to a door of an EMI-shielded enclosure even when a main pusher assembly actuator malfunctions.

Still another object of the present invention is to provide a door assembly of an EMI enclosure containing a back-up system to effect an EMI shield with the door jamb of the enclosure. A feature of the invention is that the back-up system is actuated manually. An advantage of the system is that no sophisticated tools or procedure is required to actuate the EMI shield.

Briefly, the above and other objects of the present invention are provided by a door assembly for an EMI shielded room having an electrically conductive room shield and a doorway bounded by a jamb and a flush threshold including an electrically conductive contact area connected to the room shield, said door assembly comprising a door structure including a support frame defining a door edge and opposed door face panels supported by said frame; means mounting said door structure for movement relative to the jamb to the closed position; a gap defined between the jamb and said door edge in said closed position; an electrically conductive door shield supported by said door structure and extending parallel with said face panels; and a thin, flexible sheet metal contact electrically connected to said door shield and mounted on said door structure adjacent said door edge for flexing movement in said gap toward and away from the contact area of the jamb; said door assembly being characterized by a pusher assembly supported by said frame; said pusher assembly including a relatively rigid base mounted adjacent said door edge for movement toward and away from said gap and a bumper between said base and said contact; and means for moving said base toward said gap in order to press said bumper against said contact and force said contact outwardly away from the door edge and parallel to the plane of the door to engage with said contact area of the jamb, thereby forming a single EMI seal between the door and the room.

BRIEF DESCRIPTION OF THE DRAWING

The present invention together with the above and other objects and advantages may best be understood from the following detailed description of the preferred embodiments of the invention illustrated in the drawings, wherein:

FIG. 2 is an enlarged fragmentary sectional view taken along the line 2—2 of FIG. 1;

FIG. 3 is an enlarged fragmentary sectional view taken along the line 3—3 of FIG. 1;

FIG. 4 is an enlarged fragmentary sectional view taken along the line 4—4 of FIG. 2;

FIG. 5 is an enlarged fragmentary sectional view showing engagement of the door assembly with a jamb in a wall of a shielded room;

FIG. 6 is an aerial view of the camming mechanism juxtaposed to the planar pusher assembly in an at-rest position;

FIG. 7 is an enlarged fragmentary sectional view taken along lines 7—7 of FIG. 6, of the camming mechanism in an at-rest position;

FIG. 8 is an aerial view of the camming mechanism extending the planar pusher assembly outwardly and parallel with the door plane toward the jamb in a wall of a shielded room;

FIG. 9 is an enlarged fragmentary sectional view taken along lines 9—9 of FIG. 8 of the camming mechanism in an actuated position.

DETAILED DESCRIPTION OF THE INVENTION

Figure 1:
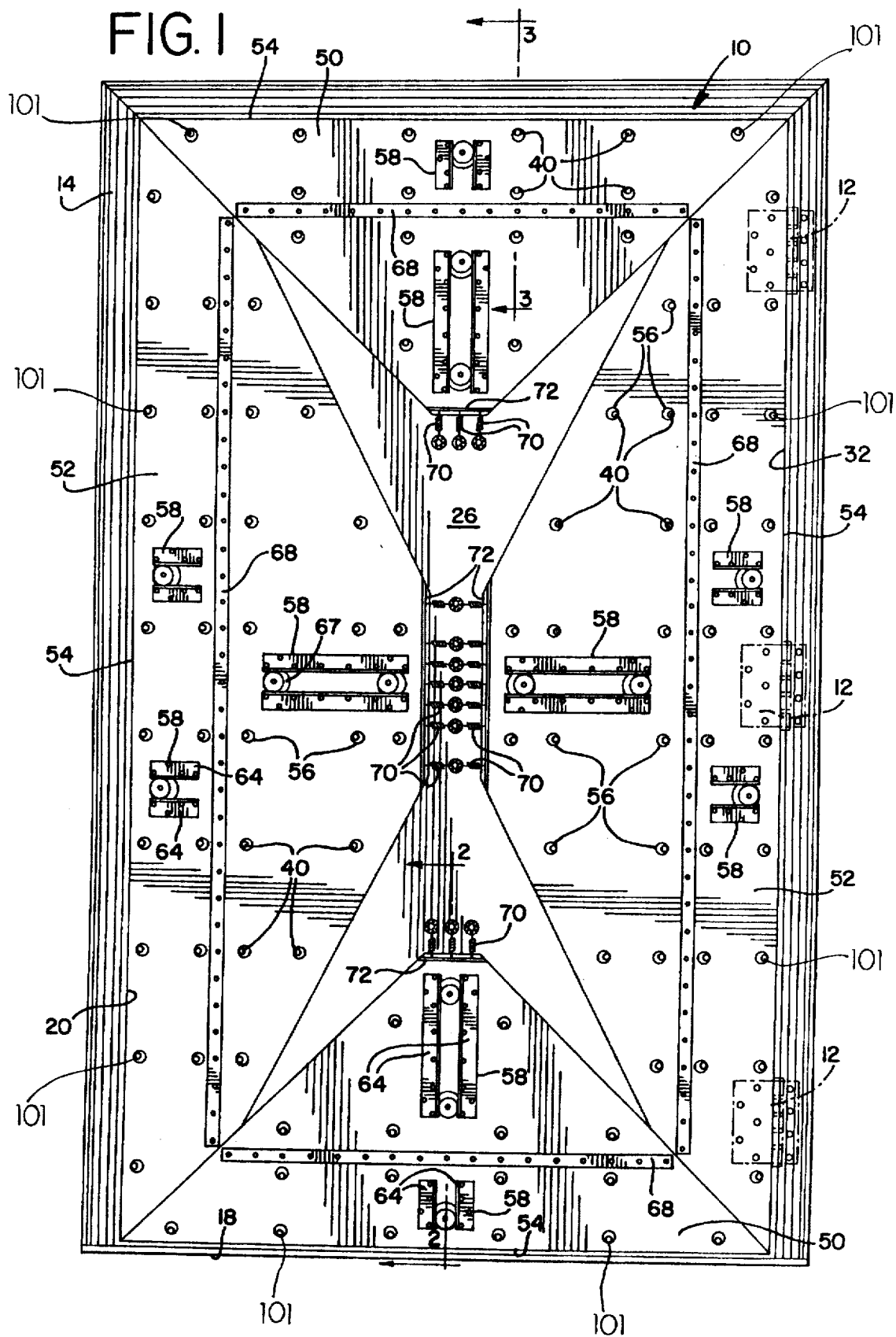
FIG. 1 is an elevational view of a door assembly embodying the present invention with components of the assembly, including pressure blocks, bladder and cover panel removed to reveal other components of the assembly.

Having reference now to the drawings, there is illustrated a door assembly generally designated as 10 and constructed in accordance with the principles of the present invention. The door assembly is supported by hinges 12 and may be closed into a door jamb 14 including a door stop 16 at the sides and top and a threshold 18 at the bottom. In the closed position there is a gap 20 at the sides, top and bottom of the door. The jamb 14 is electrically conductive and is mounted in a wall 22 of a shielded room. Wall 22 includes a conductive shield 24 in electrical contact with the jamb 14. Similarly a shield in the floor (not shown) is in contact with the threshold 18.

The door assembly has a structural frame including a support panel 26 entirely covering one face of the door assembly. A conductive shield 28 overlies the outer surface of the support panel 26. A conductive metal edge trim member 30 overlies the border of the shield 28 along all four edges of the door assembly 10.

A thin, flat, planar space 32 is defined within the door assembly at the inner surface of the support panel 26. The opposite side of the space 32 is defined by the surfaces of a plurality of pressure blocks 34. The face of the door assembly 10 opposite the support panel is provided with a cover panel 36 extending to the four edges of the door assembly 10. The borders of the cover panel 36 are received within a trim member 38.

The support panel 26 and the pressure blocks 34 are attached together at opposite sides of the planar space 32 by numerous support assemblies 40. Each support assembly 40, as best seen in FIG. 3, includes a bolt 42 extending through one of the pressure blocks 34 and threaded into a tee nut 44 received in the support panel 26. The space 32 is provided by a pair of flat washers 46 and a spacer 48 held in compression between the support panel 26 and the pressure block 34.

Figure 10:
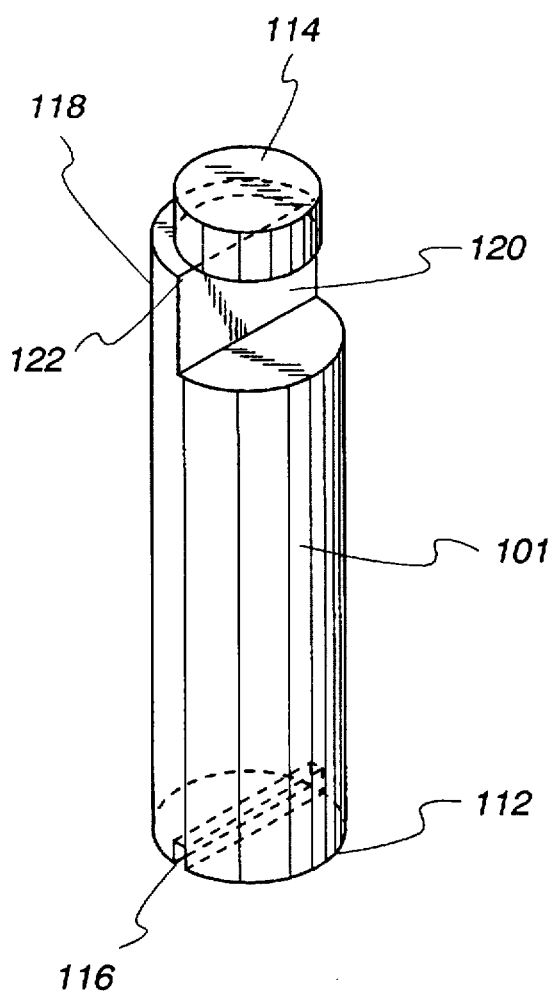
FIG. 10 is an elevated view of the cam body of the manual actuation system, in accordance with the present invention.

Within the space 32 are mounted a pair of similar upper and lower plates 50 and a pair of similar side plates 52. The plates 50 and 52 are of a relatively stiff material such as sheet metal or the like. Each plate 50 and 52 extends to one of the four linear door edges and has a linear outer edge or border 54 that generally coincides with the corresponding door edge. The borders 54 extend into the four sharp corners of the door assembly 10. The plates are provided with circular openings 56. There is a circular opening 56 for each of the support assemblies 40, and also for a camming assembly 100, the camming assembly discussed below and depicted in FIGS. 6-10. Each opening 56 has a diameter larger than the diameter of the spacers 48, and the thickness of the plates 50 and 52 is smaller than the total length of the spacers 48.

Each plate is captured between the pairs of washers 46 with limited freedom to move within the space 32 in the direction parallel to the plate and parallel to the door faces. The amount of movement is determined by the clearance provided by the openings 56 around the spacers 48. For example, in a preferred embodiment of the invention, a three eighths inch movement is permitted by using a spacer having a half-inch diameter within a seven eighths inch opening. The use of numerous openings 56 and support assemblies holds the plates 50 and 52 flat and prevents them from buckling.

The direction of movement of the plates 50 and 52 is controlled by guide assemblies 58 best seen in FIGS. 2 and 4. Each guide assembly 58 includes a bolt 60 extending through a bearing 62 and threaded into a tee nut 44. The bearing 62 is slidably received between a pair of guide flanges provided by angles 64 attached to the plate 50 or 52 near opposite sides of clearance holes 67. Each plate 50 and 52 is constrained to move only in the direction parallel to the angles 64 attached to that plate. Plates 50 move vertically and perpendicular to the top and bottom door edges. Plates 52 move horizontally, perpendicular to the side door edges. Bearings 62 are circular and eccentric so that they may be rotated to precisely adjust the positions of the plates 50 and 52.

Pneumatic Bladder
Actuating Detail

The present embodiment offers two ways to move the plates 50 and 52 outward, toward the corresponding door edge. One plate actuating means involves pressurizing a pneumatic bladder 66 that extends along a path delineated by force transfer brackets 68 attached to the plates 50 and 52 in a rectangular pattern. Each bracket 68 is parallel to and spaced inwardly from the border 54 of the respective plate 50 or 52. As seen in FIG. 3, the bladder is affixed to the side edge of a pressure block 34 and engages the bracket 68. When pressurized air or other fluid is admitted to the bladder 66, force is applied to the brackets 68 to move the plates 50 and 52 outward.

When air pressure is exhausted from the bladder 66, the plates 50 and 52 are retracted inward by return springs 70.

Springs 70 are attached in tension between inner edges 72 of the plates 50 and 52 and support bolts 74 attached to the support panel.

The full extent of each of the edges of the door assembly 10 is provided with one or more electrically conductive contacts 76. For example, each contact 76 may be several inches in length, providing a sturdy and attractive door edge. Preferably the contacts 76 are a web of flexible sheet metal material such as copper. One edge of each contact is fixed to the door assembly 10 and electrically connected to the shield 28 by the trim member 30. The opposite edge of each contact 76 has limited freedom to move outwardly away from the door edge and into contact with a jamb contact area provided by an optional insert 78 in the jamb 14 or threshold 18. Cooperating lips are provided at the free end of the contact 76 and by the trim member 38 in order to capture and protect the contact 76.

The outer borders 54 of the plates 50 and 52 are in the form of right angle flanges. Each flange 54 carries a soft, resilient bumper formed of a foam rubber like material. Bumpers transfer force from the flanges 54 of the plates 50 and 52 to the undersides of the contacts 76 and permit the contacts 76 to comply with various conditions such as variance in the width of the gap 20.

Normally, the bladder 66 is not pressurized and the springs 70 hold the plates 50 and 52 in their retracted positions. The contacts 76 are normally in their retracted positions shown in full lines in FIG. 5. When the door assembly 10 is moved between the open position and the closed position seen in FIGS. 1–3 and 5, the contacts 76 do not engage the jamb 14 or threshold 16. As a result it is not necessary to overcome frictional forces and the door is relatively easy to operate.

After the door is moved to the closed position, the bladder 66 is pressurized. Force transmitted from the expanded bladder 66 to the plates 50 and 52 by the brackets 68 act in opposition to the springs 70. The plates move in a direction precisely controlled by the assemblies 58 and for a distance precisely controlled by the assemblies 40. This movement causes the border flanges 54 to press the bumpers 80 against the undersides of the contacts 76. The contacts 76 are forced outward into intimate contact with the jamb and threshold contact areas provided by the inserts 78. This engaged position is shown in broken lines in FIG. 5.

Before the door is reopened, the bladder 66 is vented. The springs 70 retract the plates 50 and 52, and the resilience of the contact members causes them to return to the retracted position seen in full lines in FIG. 5.

Cam Body Detail

Another method for actuating pusher plates 50 and 52 is via a camming mechanism, designated generally as 100 in FIGS. 6–9. Ideally, this camming mechanism would be utilized in the event of a failure of the pneumatic system, so as to allow for continued use and operation of the EMI enclosure.

A plurality of cam bodies 101 juxtaposed to selective inner edges 57 of the pusher plates 50, 52 provides an alternative means to activate and deactivate the door-contact interaction with the door jamb of the enclosure. Manipulation of the cam bodies so as to activate the pusher plates can be done with simple tools, such as a screw driver or Allen wrench, or even by hand. Depending on where the camming mechanism is situated along the edges of the pusher plates 50, 52, either one or a plurality of camming devices can be used to actuate each of the plates. While the inner edge 57 depicted in FIGS. 6 and 8 show a slight out-of-round deviation to the otherwise circular periphery of the inner edge of the plate aperture 56, such deviation is not necessary for effective operation of the camming means. Rather, the depicted out-of-round deviation serves in this instance to facilitate aesthetic placement of the camming body 101 viz-a-viz standard door trim configurations and designs.

An exemplary cam body is depicted as numeral 101 in FIGS. 6–10. The cam body 101, generally cylindrical, has a first end 112 and a second end 114. The first end 112 of the cam body 101 has portions defining a means for axially manipulating the cam body 101. A myriad of such means are available including a transverse slot 116 for receiving a straight blade screw driver, a hexagonal aperture for receiving an Allen-wrench, or generally any configuration adapted to receive a hand-held tool with a complementary mating surface. The sides of the cam body juxtaposed to the first end 112 of the cam body 101 also can be configured to incorporate a surface roughening means for manual gripping and rotating of the cam body; such roughening means including a plurality of flutes, grooves, ridges or other configuration to allow for manual grasping or twisting.

Proximal from the second end 114 of the cam body 101 is a generally curved camming surface 118 which extends circumferencially about the periphery of the cam body for approximately 180 degrees. The curved camming surface 118 is terminated on one side by a flat surface 120 which defines a transverse notch 122.

The cam body 101 is depicted in FIGS. 6 and 7 in an at-rest position, whereby the cam body is not engaging the pusher plates 50, 52. In the at-rest position, the transverse notch 122 of the cam body is facing outwardly toward the edge of the door, with the notch 122 juxtaposed to the peripheral edge 57 of one of the openings 56 of the pusher plates 50, 52. At this at-rest position, no outward, lateral pressure is being exerted on the pusher plate 50,52 by the cam body 101.

In FIG. 9, the cam body 101 is depicted in a door-contact actuating position whereby the camming surface 118 engages the edge 57 of the opening 56 of the pusher plates 50, 52 so as to cause the plates 50, 52, and therefore the door contact 76, to extend outwardly from the edge of the door and parallel with the plane of the door to engage the door jamb 14 of the enclosure.

Actuation of the cam body 101 is done by axially manipulating the cam lock shaft 180 degrees via the transverse slot 116. A means for determining cam surface position, such as a dot or plurality of dots, 124, helps the operator to ascertain when full extension or retraction of the door contact 76 is achieved. In FIG. 6, for example, the dots 124 are situated furthest away from the door edge to signify that no cam engagement is occurring. Conversely, in FIG. 8, the dots 124 are situated closest to the door edge to signify that the camming mechanism is fully engaged and the door contact 79 thus fully extended outwardly from the door's periphery and parallel to the plane of the door.

As depicted in FIGS. 7 and 9, the first end 112 of the cam body 101 can be situated so as to be slightly below the cover panel 36, and accessible via a region of the trim member 38 defining an access aperture 126. Alternatively, the first end 112 of the cam body can be situated so as to slightly protrude from the cover panel 36 to facilitate axial rotation of the cam body 101 digitally (i.e. using the fingers or hands) via a fluted surface or other accommodating surface, discussed above.

The second end 114 of the cam body is received by a cam lock plate 128. The cam lock plate 128 is nested in a routed section of the support panel 26, which can be plywood or other suitable structural material, and fastened thereto with adhesive, one or more dowels 130, screws, or other attaching means.

Generally, the cam body 101 can be fabricated with any noncorrosive material that does not react galvanically with adjacent structures. As such, a myriad of materials are appropriate, including metallic materials such as aluminum and stainless steel, or nonmetallic materials such as reinforced plastics and composites. Materials able to withstand sheer forces of approximately five foot pounds are suitable. Typically, the camming mechanism is actuated to extend the contact 76 when the door is in the open position. The extent of this actuation is depicted as a stepped, double-arrowed line in FIGS. 7 and 9.

While the invention has been described with reference to details of the illustrated embodiment, these details are not intended to limit the scope of the invention as defined in the appended claims. For example, whereas pneumatic devices and camming devices, contained within the door structure, are used for activating the planar driver plates 50, 52, exterior means for such plate activation are also suitable. Such means could include mechanically driven devices, magnetic drivers, or electromechanical devices located outside of the door structure.

The embodiment of the invention in which an exclusive property or privilege is claimed is defined as follows:

1. A door assembly for an EMI shielded room having an electrically conductive room shield and a doorway bounded by a jamb and a flush threshold including an electrically conductive contact area connected to the room shield, said door assembly comprising:

a door structure including a support frame defining a door edge and opposed door face panels supported by said frame;

means mounting said door structure for movement relative to the jamb to the closed position;

a gap defined between the jamb and said door edge in said closed position:

an electrically conductive door shield supported by said door structure and extending parallel with said face panels; and a thin, flexible sheet metal contact electrically connected to said door shield and mounted on said door structure adjacent said door edge for flexing movement in said gap toward and away from the contact area of the jamb;

a pusher assembly supported by said frame:

said pusher assembly including a relatively rigid base mounted adjacent said door edge for movement toward and away from said gap and a bumper between said base and said contact; and means for moving said base toward said gap in order to press said bumper against said contact and force said contact outwardly away from the door edge and parallel to the face panels to engage with said contact area of the jamb, thereby forming a single EMI shield between the door structure and the room, and further comprising means for retracting said base and bumper away from said gap to permit said contact to move out of engagement with the contact area.

2. The door assembly as recited in claim 1 wherein said pusher assembly includes a thin, planar driver concealed between said face panels, said base being connected to an edge of said driver.

3. The door assembly as recited in claim 2 said moving means comprising pneumatic means engageable with said driver at a location remote from said base.

4. The door assembly as recited in claim 3, said pneumatic means comprising a bladder.

5. The door assembly as recited in claim 2, said retracting means comprising a return spring.

6. The door assembly as recited in claim 2, said moving means comprising a camming means engageable with said driver at a location remote from said base.

7. The door assembly as recited in claim 6, said camming means further comprising:

a cam body with a first surface and a second surface;

said driver having a portion defining an aperture with an inner edge, said aperture adapted to receive said cam body so as to allow said cam body to axially rotate against said inner edge of said aperture.

8. The door assembly as recited in claim 7 wherein the first surface is curved and the second surface is flat.

9. A door for an EMI shielded room, said door comprising:

a rectangular framework having square corners, opposed faces and having top, bottom and opposed side framework edges;

a metal shield extending between said framework edges;

electrical contact means carried by said framework and extending around the door periphery at said framework edges, said electrical contact means being electrically connected to said shied;

a flat, planar internal space defined by said framework, said space being parallel with said faces and extending to said framework edges;

said framework including a plurality of supports extending across said space in a direction perpendicular to said faces;

a plurality of flat, planar plates, each of said plates having an outer edge disppposed adjacent to one of said framework edges;

said plates having apertures receiving said supports with clearance permitting movement of said plates toward and away from said framework edges;

first and second force application means for moving said plates respectively outward toward said framework edges or inward away from said framework edges; and contact actuating means carried by said outer edges of said plates for moving said contact means outward in a direction parallel to said faces in response to outward movement of said plates, said first force application means comprising a pneumatic bladder spaced inward from the outer edge of each of said plates.

10. A door for an EMI shielded room, said door comprising:

a rectangular framework having square corners, opposed faces and having top, bottom and opposed side framework edges;

a metal shield extending between said framework edges:

electrical contact means carried by said framework and extending around the door periphery at said framework edges, said electrical contact means being electrically connected to said shield;

a flat, planar internal space defined by said framework, said space being parallel with said faces and extending to said framework edges;

said framework including a plurality of supports extending across said space in a direction perpendicular to said faces;

a plurality of flat, planar plates, each of said plates having an outer edge disposed adjacent to one of said framework edges;

said plates having apertures receiving said supports with clearance permitting movement of said plates toward and away from said framework edges;

first and second force application means for moving said plates respectively outward toward said framework edges or inward away from said framework edges; and contact actuating means carried by said outer edges of said plates for moving said contact means outward in a direction parallel to said faces in response to outward movement of said plates, said second force application means comprising a spring coupled to each of said plates.

11. A door for an EMI shielded room, said door comprising:

a rectangular framework having square corners, opposed faces and having top, bottom and opposed side framework edges;

a metal shield extending between said framework edges;

electrical contact means carried by said framework and extending around the door periphery at said framework edges, said electrical contact means being electrically connected to said shield:

a flat, planar internal space defined by said framework, said space being parallel with said faces and extending to said framework edges;

said framework including a plurality of supports extending across said space in a direction perpendicular to said faces;

a plurality of flat, planar plates each of said plates having an outer edge disposed adjacent to one of said framework edges;

said plates having apertures receiving said supports with clearance permitting movement of said plates toward and away from said framework edges;

first and second force application means for moving said plates respectively outward toward said framework edges or inward away from said framework edges: and contact actuating means carried by said outer edges of said plates for moving said contact means outward in a direction parallel to said faces in response to outward movement of said plates, said first force application means comprising a camming means spaced inward from the outer edge of each of said plates.

12. The door assembly as recited in claim 11, said camming means further comprising:

a cam body with a first surface and a second surface;

said apertures of said plates defining an inner edge, said apertures adapted to receive said cam body so as to allow said cam body to axially rotate against said inner edge of said apertures.

13. A door for an EMI shielded room, said door comprising;

a rectangular framework having square corners, opposed faces and having top, bottom and opposed side framework edges;

a metal shield extending between said framework edges;

electrical contact means carried by said framework and extending around the door periphery at said framework edges, said electrical contact means being electrically connected to said shield:

a flat, planar internal space defined by said framework, said space being parallel with said faces and extending to said framework edges;

said framework including a plurality of supports extending across said space in a direction perpendicular to said faces;

a plurality of flat, planar plates, each of said plates having an outer edge disposed adjacent to one of said framework edges;

said plates having apertures receiving said supports with clearance permitting movement of said plates toward and away from said framework edges;

first and second force application means for moving said plates respectively outward toward said framework edges or inward away from said framework edges; and contact actuating means carried by said outer edges of said plates for moving said contact means outward in a direction parallel to said faces in response to outward movement of said plates, wherein said second force application means comprises a camming means spaced inward from the outer edge of each of said plates.

\* \* \* \* \*